US010066299B2

(12) United States Patent
Kwong et al.

(10) Patent No.: US 10,066,299 B2
(45) Date of Patent: Sep. 4, 2018

(54) PLATING CATALYST AND METHOD

(71) Applicant: Rohm and Haas Electronic Materials LLC, Marlborough, MA (US)

(72) Inventors: Suk Kwan Kwong, Ngau Tau Kok (HK); Weijuan Zhou, Tai Po Tai Wo Road (HK); Wenjia Zhou, Fanling (HK); Dennis Chit Yiu Chan, Shatin (HK); Dennis Kwok-Wai Yee, Yuen Long (HK)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 6 days.

(21) Appl. No.: 13/775,208

(22) Filed: Feb. 24, 2013

(65) Prior Publication Data
US 2014/0242287 A1 Aug. 28, 2014

(51) Int. Cl.
| | | |
|---|---|---|
| *B05D 1/18* | (2006.01) | |
| *C23C 18/31* | (2006.01) | |
| *B01J 31/06* | (2006.01) | |
| *B01J 23/44* | (2006.01) | |
| *B01J 35/00* | (2006.01) | |
| *C23C 18/30* | (2006.01) | |
| *H05K 3/42* | (2006.01) | |
| *C23C 18/18* | (2006.01) | |
| *C23C 18/20* | (2006.01) | |
| *H05K 3/18* | (2006.01) | |
| *B01J 37/02* | (2006.01) | |
| *B01J 23/38* | (2006.01) | |
| *B01J 23/50* | (2006.01) | |
| *C23C 18/38* | (2006.01) | |
| *H05K 3/38* | (2006.01) | |
| *B01J 37/16* | (2006.01) | |

(52) U.S. Cl.
CPC .............. *C23C 18/31* (2013.01); *B01J 23/38* (2013.01); *B01J 23/44* (2013.01); *B01J 23/50* (2013.01); *B01J 31/06* (2013.01); *B01J 35/0013* (2013.01); *B01J 37/0219* (2013.01); *C23C 18/1831* (2013.01); *C23C 18/1834* (2013.01); *C23C 18/1879* (2013.01); *C23C 18/1882* (2013.01); *C23C 18/206* (2013.01); *C23C 18/2066* (2013.01); *C23C 18/30* (2013.01); *H05K 3/185* (2013.01); *H05K 3/422* (2013.01); *B01J 37/0217* (2013.01); *B01J 37/16* (2013.01); *C23C 18/38* (2013.01); *H05K 3/381* (2013.01); *H05K 2201/0257* (2013.01); *H05K 2203/0766* (2013.01); *H05K 2203/0783* (2013.01); *H05K 2203/095* (2013.01)

(58) Field of Classification Search
CPC .................................. B01J 31/06; B01J 23/44
See application file for complete search history.

(56) References Cited

U.S. PATENT DOCUMENTS

| | | | |
|---|---|---|---|
| 3,011,920 A | 12/1961 | Shipley, Jr. | |
| 3,904,792 A | 9/1975 | Gulla et al. | |
| 4,652,311 A | 3/1987 | Gulla et al. | |
| 4,725,314 A | 2/1988 | Gulla et al. | |
| 5,062,890 A * | 11/1991 | Miyashita ............. | C09D 11/18 106/31.75 |
| 7,569,508 B2 | 8/2009 | Zhou et al. | |
| 2004/0043153 A1 | 3/2004 | Okuhama et al. | |
| 2004/0043453 A1 | 3/2004 | Drocourt et al. | |
| 2005/0224931 A1* | 10/2005 | Aoki et al. ................ | 257/670 |
| 2006/0236884 A1 | 10/2006 | Leenders et al. | |
| 2008/0166500 A1* | 7/2008 | Byeon et al. ............ | 427/576 |
| 2009/0197045 A1* | 8/2009 | Okada ...................... | C22C 5/06 428/141 |
| 2012/0145555 A1 | 6/2012 | Rzeznik et al. | |
| 2012/0171363 A1 | 7/2012 | Yamamoto et al. | |
| 2013/0269569 A1* | 10/2013 | Tabayashi ............. | C09D 11/32 106/31.65 |

FOREIGN PATENT DOCUMENTS

| | | | | |
|---|---|---|---|---|
| CN | 101160376 | | 4/2008 | |
| JP | WO 2012057205 A1 * | | 5/2012 | ............. C09D 11/32 |

OTHER PUBLICATIONS

Office Action with Search Report from corresponding Chinese 1201410062057.4 application, dated Dec. 31, 2015.
Gil-Molto, et al., "Di(2-pyridyl)methylamine-palladium dichloride complex covalently anchored to a styrene-maleic anhydride copolymer as recoverable catalyst for C—C cross-coupling reactions in water", Tetrahedron 61 (2005) 12168-12176, Oct. 25, 2005.
Molar Concentrations from Wikipedia, the free encyclopedia, https://en.wikipedia.org/wiki/Molar-concentration, Jun. 23, 2016, 6 pages total.
Search report for corresponding China Application No. 201410062057.4 dated Dec. 16, 2016.

* cited by examiner

*Primary Examiner* — Dah-Wei D. Yuan
*Assistant Examiner* — Nga Leung V Law
(74) *Attorney, Agent, or Firm* — John J. Piskorski (57) ABSTRACT

A solution including a precious metal nanoparticle and a polymer polymerized from at least two monomers, (1) a monomer having two or more carboxyl groups or carboxyl acid salt groups and (2) a monomer which has π electron-available features. The solution is useful for a catalyst of a process for electroless plating a metal on non-conductive surface.

9 Claims, 2 Drawing Sheets
(2 of 2 Drawing Sheet(s) Filed in Color)

FIGURE 1

| Catalyst WB (Pd, ppm) | 5 | 10 | 15 | 25 | 50 | 100 |
|---|---|---|---|---|---|---|
| Eis Cu 880 at 40°C | | | | | | |
| Resin coverage | partial | full | | | | |
| Backlight rating | NA | 4.4 (4.25) | 4.3 (4.25) | 4.5 (4.25) | 4.3 (4.25) | 4.6 (4.25) |

PLATING CATALYST AND METHOD

FIELD OF THE INVENTION

The present invention relates to a catalyst solution comprising a precious metal nanoparticle, and more particularly, a catalyst solution comprising a precious metal nanoparticle stabilized by a specific compound useful in electroless metal plating of non-conductive substrates and used in the manufacture of electronic devices and decorative coating.

BACKGROUND OF THE INVENTION

Electroless metal deposition or plating is useful for the deposition of a metal or mixture of metals on a non-conductive or dielectric surface in the absence of an electric source. Plating on non-conductive or dielectric substrates is used in a variety of industries, including decorative plating and electronic device fabrication. One of the main applications is the manufacture of printed circuit boards. The electroless deposition of a metal on a substrate usually requires pretreatment or sensitization of the substrate surface to make the surface catalytic to the deposition process. Various methods have been developed to catalyze the substrate.

U.S. Pat. No. 3,011,920 discloses a method to catalyze a substrate by immersion of the substrate in the colloidal catalyst solution prepared by palladium ions with stannous ions to form a palladium-tin colloid. This method requires a step of acceleration after catalyzing the substrate surface, whereby the catalyst core is exposed. U.S. Pat. No. 3,904,792 discloses an improvement of colloidal palladium-tin catalysts to provide catalysts in a less acidic environment. Hydrochloric acid is replaced partially by another soluble salt of the acid. Such a palladium-tin catalyst system still presents a number of limitations. The outer shell of the catalyst colloid $SnCl_4^{2-}$ is easily oxidized, thus the catalyst particle grows in size and loses its catalytic surface area dramatically. In addition, because of environmental requirements, a tin-free catalyst for electroless plating was developed.

With good bonding to palladium, nitrogen-containing polymers were widely described in the literature to synthesize palladium nanoparticles as catalysts. U.S. Pat. No. 4,725,314 discloses a process for the preparation of a catalytic adsorbate in aqueous solution using an organic suspending agent such as polyvinyl pyrrolidone to protect a colloid. US 20120097548A discloses the use of glutathione and palladium forming a stable aqueous solution of nanoparticles, which may catalyze electroless metal deposition. US 20120145555A discloses the use of N-containing heterocyclic compounds such as histidine or urocanic acid to catalyze electroless metal deposition. However, nitrogen containing polymers not only had good interaction with palladium but also with copper. This bonding was difficult to remove and the interconnection defect problem resulted in the unreliability of electronic devices. Also, such catalysts usually worked in alkaline medium. Copper surfaces of innerlayer or base copper are easily oxidized in such alkaline medium. This causes interconnection defect problems.

U.S. Pat. No. 4,652,311A discloses the use of polyacrylic acid and polyacrylamide as suspending agents. Palladium ions are reduced by mild reducing agents in the presence of suspending agents. To stabilize against further growth of particles, the addition of a soluble alcohol solution is needed. The alcohol is more likely to drive the completion of reduction and stabilize the particles against aggregation. It works at an alkaline range and the palladium concentration ranges from 10 to 2,000 ppm. WO2011/030638A discloses the use of polyacrylic acid as a dispersing agent, which is able to avoid aggregation and sedimentation of palladium colloid. Catechol is used to suppress the palladium oxidation while a copper-acid inhibiting agent is used to limit the generation of copper colloid or copper hydroxide.

However, a colloidal catalyst system which has a balanced bath stability, adsorption capability and catalytic activity at the same time is still desired.

SUMMARY OF THE INVENTION

Inventors of this invention have now found that a precious metal colloidal catalyst system, which comprises precious metal nanoparticles stabilized by a specific type of polymer polymerized from at least two monomers, (1) a monomer having two or more carboxyl groups or carboxylic acid salt groups and (2) a monomer which has π (pi) electron-available features.

Such a tin-free catalyst system shows good stability and promising catalytic activity towards electroless plating. In addition, such a new developed colloidal catalyst system can decrease palladium concentration and has wide operation window to work effectively through a wide pH range, and it is useful for industrial applications.

BRIEF DESCRIPTION OF THE DRAWINGS

The file of this patent contains at least one drawing executed in color. Copies of this patent with color drawing(s) will be provided by the Patent Office upon request and payment of the necessary fee.

DETAILED DESCRIPTION OF THE INVENTION

As used throughout this specification, the abbreviations given below have the following meanings, unless the context clearly indicates otherwise: g=gram; mg=milligram; ml=milliliter; L=liter; m=meter; min.=minute; s=second; h.=hour; ppm=parts per million; M=molar; mM=millimolar; g/L=grams per liter.

As used throughout this specification, the word "deposition" and "plating" are used interchangeably. The word "catalyzing" and "activating" are used interchangeably throughout this specification. The word "solution comprising precious metal nanoparticles" and "catalyst solution" are used interchangeably throughout this specification. The indefinite articles "a" and "an" refer to the singular and the plural.

The present invention provides a solution for electroless plating comprising a precious metal nanoparticle and a polymer polymerized from at least two monomers, (1) a monomer having two or more carboxyl groups or carboxylic acid salt groups and (2) a monomer which has π electron-available features.

Regarding the requirement of the above monomer (1), inventors of this invention have found a polymer polymerized from at least a monomer having two or more carboxyl groups or carboxylic acid salt groups is useful for a stabilizer of precious metals such as silver. The inventors of this invention now find that a monomer (2), the monomer which has π electron-available features, can increase the stability of nanoparticles with cooperation of the monomer (1), even if the precious metal of the nanoparticles is a divalent metal such as palladium.

Monomer (1) has two or more carboxyl groups or carboxylic acid salt groups within the monomer. In other words, the monomer is an unsaturated polycarboxylic acid or salt thereof. Therefore, the polymer used in the present invention has at least two carboxyl groups or carboxylic acid salt groups within the repeating unit of the polymer. Examples of the monomer (1) include maleic acid, fumaric acid and itaconic acid and salts thereof. Maleic acid is preferably used.

Monomer (2) has π electron-available features in the monomer structure. π-electron availability means a readiness of electrons in the π bond which are able to contribute in an interaction with the metal nanoparticle/ions in this invention. As known, π electrons are located in π bonds which result from overlapping of atomic orbitals. A π-electron available feature is a functional group containing π-electrons, which are available for the interaction with the metal nanoparticle/ions in this invention. Examples of π-electron available features include C≡C structure, benzene ring and electron donating substituents on these features. Such π-electron available features are able to give extra stability by interacting through vacant orbitals of the metal atom.

Preferably, the monomer (2) is selected from the group consisting of aromatic vinyl monomer, aromatic allyl monomer and alkadiene. These monomers have π-electron availability. Examples of aromatic vinyl monomers include styrene, substituted styrene such as methyl styrene, ethyl styrene, tert-butyl styrene, 4-styrene sulfonic acid or vinyl anisole, α-methylstyrene, β-methylstyrene and trans-anithole. Examples of aromatic allyl monomer include allylbenzene, substituted allylbenzene such as allylanisole, allyltoluene and 4-allylpyrocatechol. Examples of alkadiene include 1,3-butadiene, isoprene, 2,3-dimethyl-1,3-butadiene, 1,3-pentadiene, 2-methyl-1,3-pentadiene, 3-methyl-1,3-pentadiene, 1-methoxy-1,3-butadiene, 2,3-dimethoxy-1,3-dutadiene and trans-1-phenyl-1,3-dutadiene.

Preferably, the monomer (2) does not include electronegative atoms or electron attractive groups within the monomer. Since the π bond is made up of loosely held electrons that form a diffuse electron cloud, it can be easily distorted. For a simple system containing π bond, such as a double bond, where an electronegative atom, e.g. oxygen, is present, the electron cloud would be distorted towards oxygen and the availability of the π bond electrons would be low for the interaction. On the other hand, if there is no electronegative atom present in the double bond, such as C≡C, π-electrons would be shared evenly over the bond and the availability would be high for that. For another example, styrene is one monomer having available π electrons. However, if styrene is substituted by electron attractive groups such as halides or $NO_2$, π-electron density of the benzene ring is decreased so the π-electron availability of the feature might be decreased.

The polymer used in the present invention is a polymer polymerized from at least two monomers, monomer (1) and monomer (2) described above. The polymer can be prepared by any known method. Examples for such known methods are chain growth polymerization and radical polymerization.

Because of two carboxyl groups within a repeating unit from monomer (1), the polymer used in the present invention obtains good results with stable catalyst solutions with a wide pH range in comparison with a solution comprising a polymer polymerized from a monomer having one carboxyl group such as polyacrylic acid. The difference between the polymer used in this invention and the polymer polymerized from a monomer having one carboxyl group is the pKa of the solutions comprising those polymers. The solution comprising the polymer used in this invention has at least two pKa values in comparison with a solution comprising polyacrylic acid which has one pKa≈4.58.

Though not wishing to be bound by theory, it is believed that the polymer of this invention works as a buffer as well as a stabilizer of precious metal nanoparticles so that the solution comprising the polymer used in this invention has better balance between reactivity and stability of a colloidal catalyst with a wide pH range. Because of the π-electron availability from monomer (2), the polymer used in the present invention obtains a more stable catalyst solution with cooperation of the monomer (1), even if the precious metal of the nanoparticles is a divalent metal such as palladium. The mole ratio of the unit from monomer (1) and monomer (2) is from 0.1 to 10, preferably, from 0.5 to 2.

The molecular weight (Mw) of the polymer for the solution is 400 to 700,000, more preferably, 800 to 10,000. The higher the Mw is the better is the colloidal stability but there is a direct trade off to catalytic activity, i.e. a poor catalytic activity can result.

The catalyst solution of this invention comprises a polymer polymerized from at least monomer (1) and monomer (2) and a precious metal nanoparticle. Precious metal nanoparticles of the present solution are provided by any precious metal whenever the metal can work as a catalyst. Examples of precious metals are silver, gold, platinum, palladium, rhodium, ruthenium, iridium and osmium. Preferably the precious metal is a divalent metal. More preferably, the precious metal is palladium. Mixtures of precious metals can be used, such as a mixture of silver and palladium. The amount of precious metal nanoparticles is 0.01 to 100 g/L, preferably 0.1 to 10 g/L, most preferably 0.2 to 1.0 g/L based on the total amount of the catalyst solution.

The preferable amount of the polymer within the catalyst solution is, 0.05 to 20 g/L, more preferably, 0.5 to 2.0 g/L, based on the total amount of catalyst solution.

Optionally, the present invention may comprise one or more various additives common in electroless plating catalyst compositions, such as surfactants, buffers, complexing agents and pH adjuster. pH adjusters may contain bases such as sodium hydroxide and potassium hydroxide, and simple acids such as sulfuric acid, oxalic acid, acetic acid, citric acid and other simple carboxylic acids. The amount and the choice of pH adjusters are based on the target pH value.

A solvent used in the present invention is preferably water, such as tap water or DI water. Any other solvent such as alcohol, or mixtures of solvents could be used for the present invention whenever the solvent can be dissolved with water.

Typically, the present solution has a pH of 2 to 10. The preferable pH of the present solution depends on the type and amount of polymers and reducing agents in the nanoparticle preparation procedure. Preferably, the typical present solution has the pH of more than 3, more preferably, the pH is 5 to 9, and still more preferably, the pH is alkaline, that is it has a pH of greater than 7 to 9.

The present solutions are stable solutions of nanoparticles useful as a catalyst for electroless plating for non-conductive surfaces of a material to be plated. Preferably, the present solution does not form an observable precipitate. More preferably, the present solution does not form a visually observable precipitate after an accelerated aging test and accelerated shelf life test. An accelerated aging test is conducted by putting the solution in 40° C. bath for 2 weeks with air bubbling, and an accelerated shelf life test is conducted by putting the solution at −20° C. and 60° C. for 48 hours.

The solution of the present invention can be prepared by combining a precious metal ion, a polymer and a reducing agent in a solution. Preferably, the method for preparing a solution of this invention is (a) preparing a solution comprising a precious metal ion and a polymer polymerized from at least monomer (1) and monomer (2), and (b) adding a reducing agent in the solution while stirring the solution.

The precious metal ion used in the present invention is provided by any precious metal source whenever the precious metal can be dissolved in a solvent. Organic or inorganic acid can be used with a precious metal source to help dissolution of precious metal into a solution. Precious metal elements are selected from those which are described above, such as silver, gold, platinum, palladium, rhodium, ruthenium, iridium and osmium, and the preferred precious metal element is palladium as described above.

Preferable precious metal ion sources are organic or inorganic salts of precious metals. Examples of preferable precious metal ion sources include, metal nitrates, metal nitrites, metal halides, metal oxides, metal acetates, metal sulfates, metal sulfites, metal cyanides, metal gluconates, metal fluoroborates, metal alkylsulfonates, metal thiosulfates and metal thiocyanate. Examples of metal salts include, without limitation, palladium dichloride, palladium sulfate, sodium tetrachloropalladate (II), dichlorodiammine palladium (II), palladium nitrate, palladium acetate, ammonium tetrachloropalladate (II), potassium tetrachloropalladate (II), silver nitrate, silver acetate, silver sulfate, silver methanesulfonate, silver p-toluenesulfonate, silver benzoate, silver phosphate and silver trifluoroacetate.

The amount of the precious metal ion depends on solubility of the metal salt and the desired concentration of precious metal nanoparticles in the solution of the present invention. For example, palladium salts may be used in amounts of 0.01 to 100 g/L, preferably, 0.1 to 10 g/L, more preferably, 0.2 to 1.0 g/L as metal, based on the total amount of catalyst solution.

The reducing agent used for reducing the precious metal ion is any of those reducing agents capable of reducing dissolved precious metal ions to a reduced precious metal form without formation of by-products that would interfere with catalysis of the catalyst solution. Preferable reducing agents are dimethylamino borane, sodium borohydride, hydrazine, sodium hypophosphite, hydrazine hydrate, ascorbic acid, iso-ascorbic acid, hydroxylamine sulfate, formic acid and formaldehyde.

The amount of reducing agent is any amount sufficient to reduce the desired precious metal ion. The preferable amount of reducing agent can be determined by the mole ratio with the precious metal, it is 0.5 to 2 times the moles of precious metal ion. Typically, the amount is 0.2 to 200 mM, more preferably, 2 to 20 mM, based on the total amount of metal concentration in the catalyst solution and the choice of reducing agent used in the reaction.

The method for preparing a solution of the present invention is, (a) preparing a solution comprising precious metal ions and a polymer polymerized from at least monomer (1) and monomer (2) and (b) adding a reducing agent in the solution while stirring the solution.

The first step of the method is the step of preparing a solution comprising precious metal ion and a polymer polymerized from at least monomer (1) and monomer (2).

The solution comprising precious metal ion and the polymer can be prepared by any method. For example, dissolve the polymer in a solvent such as water, then add a salt of precious metal or aqueous solution of precious metal salt within the solution; or dissolve a precious metal ion in a solvent, then add the polymer or a solution of the polymer within the solution.

The second step of the method is the step of adding a reducing agent in the solution while stirring the solution. The amount of reducing agent used in the step is any amount sufficient to form the desired precious metal nanoparticles.

Reducing agent is added in the above solution while stirring the solution. Under strong stirring conditions, the metal ions can be reduced to metal and form a lot of nanocrystals quickly and serve as seeds for further particle growth. If the stirring is inadequate, the particle size is non-uniform and some of the particles grow larger and may precipitate easily. In other words, strong stirring allows the formation of smaller nanoparticles in a narrower particle size distribution. The typical mixing rates may be from 200 to 1000 rpm.

The temperature of solution during the second step is 10° to 40° C., typically around room temperature (20° C.).

Though not wishing to be bound by theory, the inventors believe the mechanism of forming stable precious metal nanoparticles in presence of polymers of this invention is as follows: during catalyst synthesis, polymers with carboxylic groups may have a different extent of protonation at different pH values. If the degree of protonation increase, the precious metal nanoparticle/ion may be more exposed (less stable) and may be easily aggregated. When precious metal is a divalent metal such as palladium, this tendency increases remarkably. However, if there is a π-electron available feature near the exposed Pd, the π-electron may interact with a vacant d-orbital of Pd to stabilize it to a certain extent.

The inventors tested two types of polymers with divalent precious metal (palladium). The first polymer has two carboxyl groups within a repeating unit but there is no π electron available feature nearby the carboxylic groups (the site of nanoparticle formation). The second polymer has π electron available feature (double bond) nearby the carboxyl groups. Since the precious metal (palladium) is stabilized by π electron available features in the second polymer, a solution comprising the second polymer and palladium shows a homogeneous solution rather than a solution from the first polymer which shows a gel-like suspension.

Expected effect of π-electron available features:

A preferred method for preparing a colloidal catalyst solution is preparing a solution comprising 0.2 to 1.0 g/L of palladium ion and 0.5 to 2.0 g/L of poly(butadiene-maleic acid (1:1)), then adding 2 to 20 mM of dimethylamino borane under strong stirring 200 to 1,000 rpm) at 20° to 40° C.

The solution comprising a precious metal nanoparticle and a polymer polymerized from at least monomer (1) and monomer (2), colloidal catalyst of this invention, can be used in the electroless plating process for printed circuit boards. Through-holes are formed in the printed circuit board by drilling or punching or any other method known in the art. After the formation of the through-holes, the boards are rinsed with water and a conventional organic solution to clean and degrease the boards followed by desmearing the through-hole walls. Typically desmearing of the through-holes begins with application of a solvent swell.

Any conventional solvent swell may be used to desmear the through-holes. Solvent swells include, but are not limited to, glycol ethers and their associated ether acetates. Conventional amounts of glycol ethers and their associated ether acetates may be used. Such solvent swells are well known in the art. Commercially available solvent swells include, but are not limited to, CIRCUPOSIT CONDITIONER™ 3302, CIRCUPOSIT HOLE PREP™ 3303 and CIRCUPOSIT HOLE PREP™ 4120 products all obtainable from Dow Electronic Materials.

Optionally, the through-holes are rinsed with water. A promoter is then applied to the through-holes. Conventional promoters may be used. Such promoters include sulfuric acid, chromic acid, alkaline permanganate or plasma etching. Typically alkaline permanganate is used as the promoter. An example of a commercially available promoter is CIRCUPOSIT PROMOTER™ 4130 product available from Dow Electronic Materials.

Optionally, the through-holes are rinsed again with water. A neutralizer is then applied to the through-holes to neutralize any residues left by the promoter. Conventional neutralizers may be used. Typically the neutralizer is an aqueous alkaline solution containing one or more amines or a solution of 3 wt % peroxide and 3 wt % sulfuric acid. Optionally, the through-holes are rinsed with water and the printed circuit boards are dried.

After desmearing an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to, CIRCUPOSIT CONDITIONER™ 3320 and CIRCUPOSIT CONDITIONER™ 3327 products available from Dow Electronic Materials. Suitable alkaline conditioners include, but are not limited to, aqueous alkaline surfactant solutions containing one or more quaternary amines and polyamines. Commercially available alkaline surfactants include, but are not limited to, CIRCUPOSIT CONDITIONER™ 231, 3325 and 860 products available from Dow Electronic Materials. Optionally, the through-holes are rinsed with water after conditioning.

Conditioning is followed by microetching the through-holes. Conventional microetching compositions may be used. Microetching is designed to provide a micro-roughened copper surface on exposed copper (e.g. innerlayers and surface etch) to enhance subsequent adhesion of deposited electroless and electroplate. Microetches include, but are not limited to, 60 g/L to 120 g/L sodium persulfate or sodium or potassium oxymonopersulfate and sulfuric acid (2%) mixture, or generic sulfuric acid/hydrogen peroxide. An example of a commercially available microetching composition includes CIRCUPOSIT MICROETCH™ 3330 product available from Dow Electronic Materials. Optionally, the through-holes are rinsed with water.

A pre-dip is then applied to the microetched through-holes. Any acidic solution capable of removing copper oxides on copper surfaces without interfering with the catalyst solution can be used. Examples of pre-dips include oxalic acid, acetic acid, ascorbic acid, phenolic acid, phosphoric acid, boric acid, and salts thereof. Optionally, the through-holes are rinsed with cold water.

A catalyst solution comprising a precious metal nanoparticle as described above is then applied to the through-holes. The walls of the through-holes are then plated with copper with an alkaline electroless composition without an accelerating step. Any conventional electroless plating bath may be used. A commercially available electroless copper plating bath includes, but is not limited to, CIRCUPOSIT™ 880 electroless copper plating bath available from Dow Electronic Materials.

After the copper is deposited on the walls of the through-holes, the through-holes are optionally rinsed with water. Optionally, anti-tarnish compositions may be applied to the metal deposited on the walls of the through-holes. Conventional anti-tarnish compositions may be used. Examples of anti-tarnish compositions include ANTI TARNISH™ 7130 and CUPRATEC™ 3 products (obtainable from Dow Electronic Materials). The through-holes may optionally be rinsed by a hot water rinse at temperatures exceeding 30° C. and then the boards may be dried.

EXAMPLES

Test Methods

The properties of the catalyst were evaluated by observing test coupons plated by electroless copper plating according to the process described below. As the test coupon, conventional FR-4 laminate and SY-1141 from Shengyi were used. For surface coverage test, bare laminate was used. For backlight test, Cu clad laminate with inner layer copper was used.

(1) Test coupon was cut into 1×6 cm² and its edges were sandblasted by SiC#240, then cleaned in RO (Reverse osmosis) water for several times and blown dried.
(2) Processed through the swelling, oxidizing, neutralizing, conditioning and microetching steps shown in Table 1.
(3) The test coupon was then dipped in the catalyst solution at 40° C. for 10 minutes at various pH values of 2.9 to 10.9 as shown in each example. The test coupon was washed with deionized water.
(4) Electroless copper plating was conducted at 35° or 40° C. for 15 minutes.

TABLE 1

| | process flow for electroless Cu deposition tests | | | | |
|---|---|---|---|---|---|
| Process | Components | Volume | Temperature [° C.] | Duration [min] | Rinse time [min] |
| 1 Sweller | Hole Promoter 211 | 12.5% | 80 | 7 | 3 |
| | CUPOSIT ™ Z | 10.0% | | | |
| 2 Oxidizer | Oxidizer 213A-1 | 10.0% | 80 | 10 | 3 |
| | CUPOSIT ™ Z | 15.0% | | | |
| 3 Neutralizer | Neutralizer 216-5 | 5.0% | 42 | 5 | 3 |
| 4 Conditioner | Cleaner Conditioner 231 | 3.0% | 43 | 5 | 4 |
| 5 MicroEtch | Sodium Persulfate | 75 g/L | RT | 2 | 3 |
| | $H_2SO_4$ | 2.0% | | | |
| 6 Catalyst | Pd: 15 ppm | 3.0% | 40 | 10 | 3 |
| 7 Electroless Copper | CIRCUPOSIT ™ 880 Electroless Copper | Nil | 35 | 15 | 2 |

1. Plating Coverage Test

Plating coverage of test coupons was assessed using the plating coverage grading scale defined below.

Full coverage—more than 95% of area on the surface of test coupon was plated.

High—more than 75% and less than 95% of area on the surface of test coupon was plated.

Medium—more than 50% and less than 75% of area on the surface of test coupon was plated.

Figure 1:
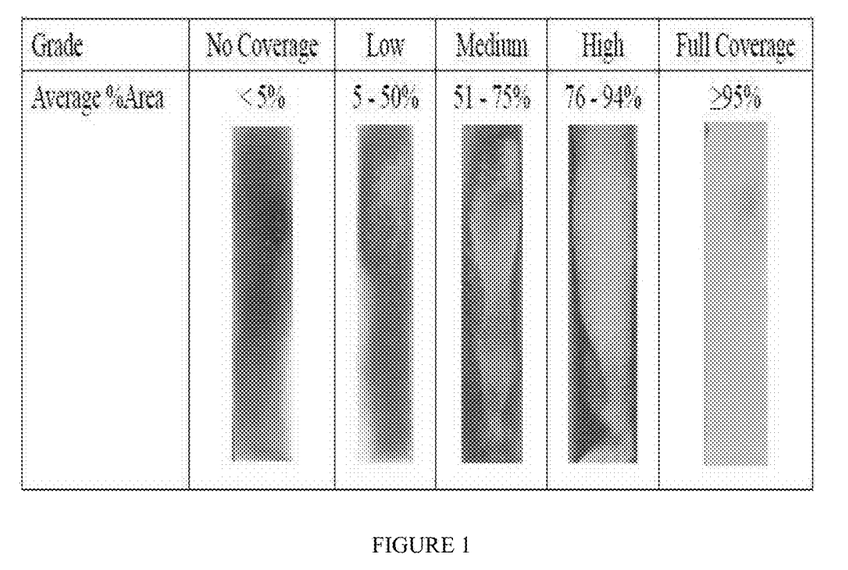
FIG. 1 shows the results of a plating coverage test for electroless copper plating on a test coupon.

See FIG. 1: Low—more than 5% and less than 50% of area on the surface of test coupon was plated.

No Coverage—less than 5% of area on the surface of test coupon was plated.

2. Backlight Test

Backlight test was conducted according to the process below.

1-mm-thick cross sections from each board were placed under a conventional optical microscope of 50× magnification under transmission mode. The quality of the copper deposit was determined by the amount of light that was observed under the microscope and compared with the European backlight Grading Scale 0-5. If no light was observed, the section was completely black and was rated 5.0 on the backlight scale. This indicated complete copper coverage. If light passed through the entire section without any dark area, this indicated very little to no copper metal deposition on the walls and the section was rated 0. If sections had some dark regions as well as light regions, they were rated between 0 and 5 comparing with the standard.

3. Accelerated Aging Test (AAT)

Accelerated Aging Test was conducted as follows;

A catalyst working bath or a concentrate with a fixed volume 50 mL was prepared, and then the solution was subjected to accelerated aging test by bubbling air at a rate of 10 mL/min under a bath temperature maintained at 40° C. for 7 days or a few weeks. After that, coverage test and backlight test were carried out again using these accelerated aging catalyst working baths to identify whether the catalytic activity was lost or not. Meanwhile, other corresponding tests such as UV-vis absorption were also carried out.

Examples 1-4: Pd-PBDMA Catalyst System from Different Palladium Salts

Example 1

Step 1—Measured 2.38 g of poly (butadiene-maleic acid) 1:1 molar (Mw=10,000-15,000) solution (42%), and dissolved it with 25 ml of deionized (DI) water; mixed it with 780 ml of DI water into a 3 liter beaker with stirring; and added 1.0 g of dichlorodiammine palladium (II) into the solution with stirring. The pH was adjusted by NaOH to 3.0 to 4.0.

Step 2—Quickly injected 7 mL of freshly prepared 1.0 mol/L dimethylaminoborane (DMAB) into the above solution with strong stirring at 500 rpm using a magnetic stirrer and continued stirring for over 1 h and obtained Pd nanoparticles (Pd catalyst concentrate).

Step 3—For storing the prepared nanoparticles, the pH was adjusted to 9.0-9.5 after 3-4 hours from the injection of the reducing agent. The total volume was topped up to a final volume of 1 liter.

The ingredients of Pd concentrate are written below.

Pd catalyst concentrate:
Pd ion: 0.5 g/L
PBDMA as stabilizer: 1.0 g/L
DMAB: 7.0 mM The Pd catalyst concentrate which was obtained was diluted to 15 ppm as [$Pd^{2+}$] by DI water, then the electroless copper plating process shown Table 1 was conducted. The results of resin coverage and backlight rating at pH2, 3, 5 and 7 both before and after one day Accelerated Aging Test (AAT) of each working bath(s) are shown in Table 2.

Example 2-4

Pd catalyst concentrates were prepared as in Example 1 except that the palladium salt (dichlorodiammine palladium (II)) was changed to palladium dichloride (Example 2), sodium tetrachloropalladate (II) (Example 3) and palladium sulfate (Example 4) respectively and storage pH was changed as shown in Table 2. Electroless copper plating was by the same process as in Example 1, and the results are shown in Table 2.

TABLE 2

| | | | | Resin coverage/Backlight rating at | | | |
|---|---|---|---|---|---|---|---|
| Example | Pd salts | Storage pH | WB 1-day AAT | pH 2 | pH 3 | pH 5 | pH 7 |
| 1 | $(NH_3)_2PdCl_2$ | 9.1 | before | NA | Y/3.7 | — | — |
| | | | after | NA | NA | NA | NA |
| 2 | $PdCl_2$ | 4.0 | before | Y/4.2 | Y/4.4 | Y/4.3 | Y/NA |
| | | | after | Y/4.3 | Y/4.4 | Y/3.9 | Y/NA |
| 3 | $Na_2PdCl_4$ | 4.4 | before | Y/4.2 | Y/4.2 | Y/4.3 | Y/3.5 |
| | | | after | Y/4.1 | Y/4.4 | Y/4.4 | Y/3.6 |
| 4 | $PdSO_4$ | 6.0 | before | Y/4.2 | Y/4.3 | Y/3.5 | Y/NA |
| | | | after | Y/4.1 | Y/4.2 | Y/NA | — |

Y: resin was covered by Cu plating
WB 1-day AAT: Working bath with 1-day AAT
"—": Catalysts showed no resin coverage
NA: not applicable The test results showed that the catalysts with stabilizer synthesized by maleic acid (a monomer having two carboxylic groups) and butadiene (π-electron available feature) were able to work with tunable pH. Since the solution comprising the stabilizer gave two pKa values, the catalytic activity was different at different pH ranges.

Example 5: Effect of Palladium Concentration

A Pd catalyst concentrate was prepared the same as in Example 1 except that the following palladium source and condition were used. The Pd catalyst concentrate which was obtained was diluted to 5, 10, 15, 25, 50 and 100 ppm as [$Pd^{2+}$], then electroless copper plating was conducted according to the same process as in Example 1.
(Pd catalyst concentrate)
Pd ion: 0.5 g/L (Pd source: $Na_2PdCl_4$)
PBDMA as stabilizer: 1.0 g/L
DMAB: 7.0 mM
(Other condition)
Synthesis temperature: 20-25° C.
Storage pH after synthesis: 8.9
Catalyst working bath pH: 4.0

Figure 2:
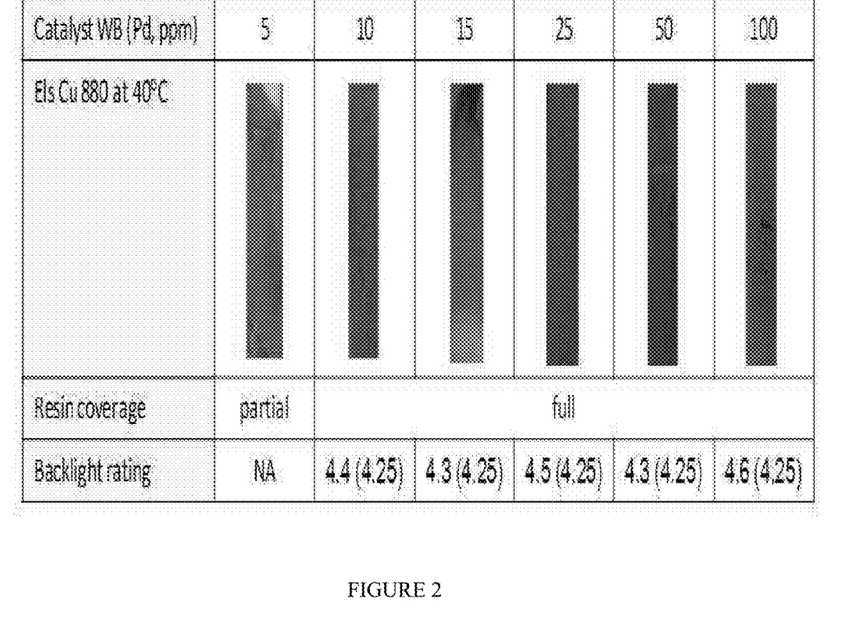
FIG. 2 shows a catalytic activity profile for palladium colloidal catalyst for electroless copper plating.

Results are shown in FIG. 2 which is the catalytic profile for Pd colloidal catalyst system in Example 5.

From the test results, catalysts with stabilizers synthesized by maleic acid (a monomer having two carboxyl groups) and butadiene (π electron available feature) worked at least at 10 ppm. It is quite a low concentration and mild condition. The backlight values for each sample are also provided in FIG. 2. The values provided are the average backlight readings for 10 to 15 holes with the lowest backlight rating for each sample in parenthesis.

Examples 6-9: Catalyst Concentrate Stability Against AAT

Pd catalyst concentrates were prepared the same as in Example 1 except that the stabilizer was changed to Poly (4-styrenesulfonic acid-co-maleic acid) sodium salt (PSSA-coMA, Example 7), Poly(styrene-alt-maleic acid) sodium salt (PSMA, Example 8), Poly(acrylic acid) (PAA, Example 9). Chemical structure and Mw of each stabilizer is shown in table 5. After the catalyst concentrate was prepared, the accelerated aging test (AAT) disclosed above was conducted.
Pd catalyst concentrate:
Pd ion: 0.5 g/L (Pd source: either $Na_2PdCl_4$ or $(NH_3)_2PdCl_2$)
Stabilizer: 1.0 g/L
DMAB: 7.0 mM Results are shown in Table 3.

TABLE 3

The relationship between pKa(s) of stabilizers and pH range showing catalytic activity.

| Example | Metal salt | Stabilizer | pKa(s) | Stability of catalyst concentrate (against AAT) | Cat. working bath shown catalytic activity at pH |
|---|---|---|---|---|---|
| 6 | $Na_2PdCl_4$ | PBDMA | 3.7, 6.6 | >2 weeks | 2-7 |
| 7 | $Na_2PdCl_4$ | PSSAcoMA | 2.2, 4.4, 7.3 | >2 weeks | 2-7 |
| 8 | $(NH_3)_2PdCl_2$ | PSMA | 4.0, 8.0 | unable to be recorded* | 2-9 |
| 9 | $(NH_3)_2PdCl_2$ | PAA | 4.6 | <2 weeks | 2-5 |

*Too many bubbles were generated during AAT. This greatly affected the testing volume.

Example 9 was a comparative example.

From the test results, the stabilizers which had π electron-available features maintained the stability of the catalysts against accelerated aging conditions for a wide pH range without losing catalytic activity.

Examples 10-20: Effect of Stabilizer

Pd catalyst concentrates were prepared the same way as in Example 1 except that the stabilizer and palladium source were changed as shown in Tables 4 and 5. Electroless copper plating was conducted by the same process as in Example 1. The results are shown in Tables 4 and 5.

TABLE 4

The relationship of polymer functional groups or features towards the stability and the performance of Pd colloidal catalysts.

| Example | Stabilizer/Size or MW | Abbreviation/ CAS no. | Structure | COOH | Features π electron availability | Stability/ Backlight (BL) Performance |
|---|---|---|---|---|---|---|
| 11 | Poly(2-ethyl-2-oxazoline)/ 50,000 | PEO/ 25805-17-8 | | no | low | unstable catalyst |
| 12 | Poly(acrylamide)/ 10,000 | PAM/ 9003-05-8 | | no | low | unstable catalyst |
| 13 | Poly(sodium 4-styrenesulfonate)/ 70,000 | PSSA/ 25704-18-1 | | no | medium | Stable catalyst BL: 0.5 (0.5) at acidic |
| 9 | Poly(acrylic acid)/ 100,000 | PAA/ 9003-01-4 pKa = 4.6 | | 1 | low | Stable catalyst BL: 4.3 (4.25) at acidic |
| 10 | Polyglutamate, sodium salt/ 500,000 | PGA/ 28829-38-1 | | 1 | medium | Stable catalyst BL: 4.2 (4.0) at acidic |
| 14 | Polyepoxysuccinic acid/ 2,300 | PESA/ 51274-37-4 pKa = 4.7, 4.9 | | 2 | low | No stable catalyst formed |
| 15 | Poly(isobutylene-co-maleic acid) sodium salt (cross-linked)/ 24-40 μm | PIBcoMA/ 39612-00-5 | | 2 | low | Stable catalyst formed with gel-like suspension |
| 16 | Poly(methyl vinyl ether-alt-maleic acid)/ 80,000 | PMVEMA/ 25153-40-6 | | 2 | low | Stable catalyst BL: 2.0 (2.0) at acidic |

TABLE 4-continued

The relationship of polymer functional groups or features towards the stability and the performance of Pd colloidal catalysts.

| Example | Stabilizer/Size or MW | Abbreviation/ CAS no. | Structure | COOH | π electron availability | Stability/ Backlight (BL) Performance |
|---|---|---|---|---|---|---|
| 7 | Poly(4-styrenesulfonic acid-co-maleic acid) sodium salt solution/ 20,000 | PSSAcoMA/ 68037-40-1 pKa (1 g/L at 25° C.) = 2.2, 4.4, 7.3 | | 2 | high | Stable catalyst BL: 4.3 (4.25) at acidic |
| 8 | Poly(styrene-a/t-maleic acid) sodium salt solution/ 350,000 | PSMA/ 25736-61-2 pKa (1 g/L at 25° C.) = 4.0, 8.0 | | 2 | high | Stable catalyst BL: 4.2 (4.0) at acidic |
| 6 | Poly(butadiene-maleic acid) 1:1 (molar)/ 10,000-15,000 | PBDMA/ 28265-35-2 pKa (1 g/L at 25° C.) = 3.7, 6.6 | | 2 | high | Stable catalyst BL: 4.5 (4.25) at acidic |
| 17 | Poly(acrylic acid-co-maleic acid) sodium salt/ 70,000 | PAAcoMA/ 52255-49-9 pKa = 3.2, 4.6, 7.9 | | 3 | medium | Stable catalyst BL: 2.8 (2.5) at acidic |

TABLE 5

Synthetic details of Pd catalysts and the Pd concentration/pH range in their corresponding catalyst working baths.

| | | | | | | Cat. working bath | |
|---|---|---|---|---|---|---|---|
| Example | Metal salt | Stabilizer | [Stab.], g/L | T/° C. | Storage pH | [Pd], ppm | Workable pH range* |
| 1 | (NH3)4PdCl2 | PBDMA | 1.0 | RT | 9.1 | 15 | 3 |
| 2 | PdCl2 | PBDMA | 1.0 | RT | 4.0 | 15 | 2-7 |
| 3 | Na2PdCl4 | PBDMA | 1.0 | RT | 4.4 | 15 | 2-7 |
| 4 | PdSO4 | PBDMA | 1.0 | RT | 6.0 | 15 | 2-7 |
| 18 | (NH3)2PdCl2 | PSSAcoMA | 1.0 | RT | 9.5 | 15 | 2-5 |
| 19 | PdCl2 | PSSAcoMA | 1.0 | RT | 1.8 | 15 | 2 |
| 7 | Na2PdCl4 | PSSAcoMA | 1.0 | RT | 6.0 | 15 | 2-7 |
| 20 | PdSO4 | PSSAcoMA | 1.0 | RT | 2.2 | 15 | 2-3 |

TABLE 5-continued

Synthetic details of Pd catalysts and the Pd concentration/pH range in their corresponding catalyst working baths.

| Example | Metal salt | Stabilizer | [Stab.], g/L | T/° C. | Storage pH | Cat. working bath [Pd], ppm | Workable pH range* |
|---------|-----------|------------|--------------|--------|------------|-----------------------------|--------------------|
| 8 | (NH3)4PdCl2 | PSMA | 1.0 | RT | 9.6 | 15 | 2-9 |
| 16 | (NH3)4PdCl2 | PMVEMA | 0.5 | RT | 9.5 | 15 | 3 |
| 17 | (NH3)4PdCl2 | PAAMA | 0.5 | RT | 9.5 | 15 | 3 |
| 15 | (NH3)4PdCl2 | PIBcoMA | 1.0 | Stable catalyst with gel like suspension | | | |
| 9 | (NH3)4PdCl2 | PAA | 1.0 | RT | 8.7 | 15 | 2-5 |
| 10 | (NH3)4PdCl2 | PGA | 1.0 | RT | 9.2 | 15 | 3 |
| 13 | (NH3)4PdCl2 | PSSA | 1.0 | Stable catalyst with limited catalytic activity | | | |
| 11 | (NH3)4PdCl2 | PEO | 0.5-2.0 | Unstable catalyst | | | |
| 12 | (NH3)4PdCl2 | PAM | 0.5-2.0 | Unstable catalyst | | | |
| 14 | (NH3)4PdCl2 | PESA | 0.5-2.0 | Unstable catalyst | | | |

*Workable pH range means the catalyst working baths at that pH range were able to give high resin coverage (76%-94%) of bare laminates.

Referring to Table 4, stabilizers of Examples 6, 7 and 8 had both (1) two carboxyl groups within a repeating unit and (2) strong π electron available features. The Pd colloidal catalysts of Examples 6, 7 and 8 were stable with high backlight performance. The stabilizer of Example 13 had a π electron available feature (poly(sodium 4-styrene sulfonate)) but no carboxyl groups. Backlight performance of the catalyst for Example 13 was not good although the stability was high. Because of the lack of carboxyl groups, the catalyst did not have a different extent of protonation at different pH values so did not have a different extent of stabilization. High stability of the catalyst depended on the strong acidity of the stabilizer because the sulfonic group is a strong acid group.

Stabilizers of Examples 14, 15 and 16 had two carboxyl groups within a repeating unit but there was no π electron available feature. Example 14 did not form a stable catalyst, and Examples 15 and 16 did form a stable catalyst but the backlight test was not good. These results showed the stabilizers had (1) at least two carboxyl groups within a repeating unit and (2) π electron available features were required to obtain high stability of a Pd catalyst with good backlight performance for wide pH range, especially a weak acid condition.

Examples 21-24: Silver Colloidal Catalyst Stabilized by PBDMA

Example 21

A Ag catalyst concentrate was prepared as in the same way as in Example 1 except that the Pd source and amount was changed to 1.7 g of silver nitrate (AgNO$_3$) and the amount of reducing agent (DMAB) was changed to 20 mM. The Ag catalyst concentrate obtained is shown below.
Ag catalyst concentrate:
Ag ion: 1.08 g/L
Reducing agent (DMAB): 20 mM The Ag catalyst concentrate was diluted to 270 ppm and electroless copper plating was done according to the process as in Example 1.

Examples 22-24

Ag catalyst concentrates were prepared the same as in Example 21 except the amounts of Ag ion and PBDMA were changed as shown in table 6. The Ag catalyst concentrates were diluted to 270 ppm and electroless copper plating was conducted according to the process as in Example 1.

TABLE 6

The Ag catalytic activity at different working bath pH range

| | WB pH shown catalytic activity/backlight rating | | | | |
|---------|-------|-------|-------|-------|-------|
| Example | pH2 | pH2.5 | pH3 | pH5 | pH7 | pH9 |
| 22 | Y/3.8 | Y/4.6 | Y | N | N | N |
| 23 | NA | NA | Y/4.1 | Y/2.0 | N | N |
| 21 | NA | NA | Y/4.5 | Y/3.2 | N | N |
| 24 | NA | NA | Y/4.4 | Y/4.3 | Y | N |

Referring to table 6, PBDMA also stabilized silver nanoparticles, and the solution comprising the silver nanoparticles stabilized by PBDMA showed catalytic activity.

What is claimed is:

1. A solution consisting of precious metal nanoparticles from precious metal sources, a solvent selected from the group consisting of water, alcohol and mixtures thereof, a reducing agent, and a polymer, wherein the polymer is polymerized from two monomers, (1) a monomer having two or more carboxyl groups or carboxyl acid salt groups and (2) a monomer which has π electron-available features, wherein a mole ratio of monomer (1) to monomer (2) is from 0.1 to 10, and one or more additives selected from the group consisting of buffers, and pH adjusting agents, wherein the solution has at least two pKa values.

2. The solution of claim 1, wherein the monomer (2) is selected from the group consisting of aromatic vinyl monomer and alkadiene.

3. The solution of claim 1, wherein the monomer (2) is selected from the group consisting of styrene, substituted styrene and butadiene.

4. The solution of claim 1, wherein the monomer (1) is maleic acid or salts thereof.

5. The solution of claim 1, wherein the precious metal nanoparticles are divalent metal.

6. The solution of claim 5, wherein the precious metal nanoparticles are palladium.

7. The solution of claim 1, wherein the mole ratio of the monomer (1) to the monomer (2) is from 0.5 to 2.

8. The solution of claim 1, wherein the polymer has a molecular weight (Mw) of 400 to 700,000.

9. The solution of claim 8, wherein the polymer has a molecular weight (Mw) of 800 to 10,000.

* * * * *